(12) United States Patent
Ravkin et al.

(10) Patent No.: US 6,851,436 B1
(45) Date of Patent: Feb. 8, 2005

(54) SUBSTRATE PROCESSING USING A FLUID RE-CIRCULATION SYSTEM IN A WAFER SCRUBBING SYSTEM

(75) Inventors: Michael Ravkin, Sunnyvale, CA (US); John deLarios, Palo Alto, CA (US); Afshin Nickhou, Campbell, CA (US); Katrina Mikhaylichenko, San Jose, CA (US); James P. Garcia, Santa Clara, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/186,908

(22) Filed: Jun. 28, 2002

(51) Int. Cl.[7] .............................................. B08B 3/00
(52) U.S. Cl. ........................ 134/109; 134/184; 134/186; 134/902; 15/21.1; 15/88.2; 15/88.3
(58) Field of Search ................................ 134/6, 10, 34, 134/109, 110, 111, 184, 186, 1.3, 26, 37, 902; 15/88.2, 88.4, 102, 21.1, 88.3

(56) References Cited

U.S. PATENT DOCUMENTS

| | | | | |
|---|---|---|---|---|
| 4,194,263 A | * | 3/1980 | Herpers et al. | 15/353 |
| 4,295,244 A | * | 10/1981 | Herpers et al. | 15/320 |
| 4,377,017 A | * | 3/1983 | Herpers et al. | 15/320 |
| 4,859,158 A | * | 8/1989 | Weinbrecht | 418/9 |
| 5,263,504 A | * | 11/1993 | Bailey et al. | 134/176 |
| 5,564,159 A | * | 10/1996 | Treiber | 15/302 |
| 5,890,251 A | * | 4/1999 | Terui | 15/88.2 |
| 6,273,100 B1 | * | 8/2001 | Andreas et al. | 134/1.3 |
| 6,378,534 B1 | * | 4/2002 | Olesen et al. | 134/1.3 |

FOREIGN PATENT DOCUMENTS

JP     10-321577     * 12/1998

* cited by examiner

Primary Examiner—M. Kornakov
(74) Attorney, Agent, or Firm—Martine & Penilla, LLP

(57) ABSTRACT

A system and method for re-circulating processing fluids in a substrate processing system is provided. A fluid re-circulation system for a brush box processing tool includes a supply tank into which processing chemicals, DI water, or other processing fluids are introduced into the system from an external source. Processing chemicals are provided to the brush box and dispensed to process a substrate. Dispensed fluids drain from the brush box into a diverter through which fluids either flow to waste, or into a collection tank. Fluids from the collection tank flow into the supply tank to re-circulate for wafer processing. The re-circulation system includes filters for maintaining chemical purity, and chemical concentration is monitored and adjusted as necessary.

16 Claims, 4 Drawing Sheets

SUBSTRATE PROCESSING USING A FLUID RE-CIRCULATION SYSTEM IN A WAFER SCRUBBING SYSTEM

BACKGROUND OF THE INVENTION

1. Field of the Invention

The present invention relates generally to substrate and semiconductor wafer preparation systems and methods, and more specifically to a re-circulation system for chemicals and deionized water used in substrate and semiconductor wafer scrubbing systems.

2. Description of the Related Art

In the fabrication of semiconductor devices, there is a need to perform wet cleaning of substrates at various stages of the fabrication process. The wet clean is designed to wash away any by-products of the fabrication process, remove contaminants, and to achieve and maintain the necessary degree of cleanliness essential to proceed to a subsequent fabrication operation. In some cases, the wet clean itself is a fabrication step, and the plurality of tools used for wet cleaning, scrubbing, buffing, etching and the like use such fluids as dionized water (DI water) for rinsing, and a plurality of chemicals supplementing cleaning, scrubbing, polishing, buffing, or otherwise processing wafers according to processing needs.

Similarly, in the fabrication of hard disk drives, cleaning operations are needed to maintain a clean and smooth disk substrate. Residue or contaminants remaining on substrates in the fabrication of hard disks and other devices utilizing similar substrates is likewise unacceptable, and various rinsing, scrubbing, buffing, and the like tools are used for periodic cleaning, scrubbing, and rinsing operations, and using DI water and other chemicals for the desired processes.

Substrate cleaning and scrubbing techniques, methods, and apparatus are plentiful and known in the art, and incorporate such operations as rinsing and scrubbing, immersion, as well as the application of thermal, mechanical, chemical, electrical, or sonic energy. One known cleaning and scrubbing technique implements brush stations in which polyvinyl alcohol (PVA) brushes are used to scrub both active and back sides of a substrate. Materials other than PVA may be also employed in scrubbing operations. In a typical brush station process, a substrate is rotated in a vertical or horizontal orientation by substrate drive rollers, also called substrate edge wheels. As the substrate is rotated, a pair of cylindrical brushes or pads are brought into contact with the opposing surfaces of the wafer. The brushes or pads are mounted on counter-rotating mandrels disposed on opposite sides of the wafer being processed. The mandrels span the diameter of the substrate across the substrate center. The rotation of the mandrels rotates the cylindrical brushes or pads which are then applied against the opposing surfaces of the rotating substrate. During the scrubbing operation in some systems, nozzles direct sprays of liquid, e.g., an abrasive slurry, a chemical solution, or a rinse solution, on the opposing surfaces of the wafer. In some applications, liquid for polishing, scrubbing, or cleaning is supplied through the brush or pad, and some systems employ a combination of nozzles and fluid delivery through the brush or pad. In order to maintain the PVA brushes in a condition useful for substrate processing, fluids need to be supplied through the brush, or dispensed on the surface of the brush, either continuously or periodically with only short interruptions whether the brush is being used for processing a wafer or is in an idle state or mode.

As can be appreciated, scrubbing tools such as a typical brush box consume a large quantity of water and other chemicals. A typical dual-brush scrubbing tool implementing through-the-brush dispensing of chemicals for processing or DI water for rinsing and using PVA brushes consumes approximately two to four liters per minute of dispensed fluid during operation. Processing tools and systems currently in use supply the selected DI water and/or chemicals to the system or tool for use, and then drain the consumed fluids to waste.

In view of the foregoing, there is a need for substrate brush station preparation systems and methods that incorporate re-circulation of chemicals and DI water used in substrate processing and/or in the maintenance of the tool, station or system.

SUMMARY OF THE INVENTION

Broadly speaking, the present invention fills these needs by providing a re-circulation system to re-circulate chemicals, DI water, or other fluids in a brush scrubbing tool, station, or system used in the manufacture of semiconductor wafers or other substrates. The present invention can be implemented in numerous ways, including as a process, an apparatus, a system, a device, or a method. Several embodiments of the present invention are described below.

In one embodiment, a fluid re-circulation system for use in a brush box of a semiconductor wafer processing system is disclosed. The fluid re-circulation system includes a supply tank for containing processing fluids to be used in the brush box. The supply tank has an inlet from an external source and an outlet. The fluid re-circulation system further includes a collection tank coupled in flow communication with the supply tank. The collection tank has an inlet and an outlet. The fluid recirculation system further includes a diverter. The brush box is coupled in flow communication with the diverter, and the diverter is coupled in flow communication with the collection tank. The fluid recirculation system also includes a monitor providing for monitoring of a concentration of processing fluids circulating through the fluid re-circulation system.

In another embodiment, a fluid re-circulation system for use in a semiconductor wafer brush box scrubbing tool is disclosed. The fluid re-circulation system includes a collection tank for capturing processing fluids used in the semiconductor wafer brush box scrubbing tool. The fluid re-circulation system further includes a holding tank for maintaining a sufficient volume of processing fluids in the fluid re-circulation system to enable a processing duty cycle of up to 100 percent in the semiconductor wafer brush box scrubbing tool. The fluid re-circulation system also includes a supply tank. The supply tank has an inlet from an external source and is capable of selectively receiving one of re-circulating processing fluids, fresh processing fluids, and adjusting processing fluids for adjusting a concentration of processing fluids within the fluid recirculation system. The semiconductor wafer brush box scrubbing tool is coupled in flow communication with a diverter. The diverter is coupled in flow communication with the collection tank.

In still a further embodiment, a processing fluid re-circulation system is disclosed. The processing fluid re-circulation system includes a brush box processing tool for processing a semiconductor wafer. The brush box processing tool has an inlet for receiving processing fluids. The processing fluid re-circulation system further includes a collection tank for receiving processing fluids from the brush box processing tool, and a diverter. The brush box processing tool is in flow communication with the diverter and the diverter is in selective flow communication with one of the collection tank and a drain. The processing fluid re-circulation system also includes holding tank for receiving processing fluids from the collection tank. The holding tank is coupled in flow communication with the collection tank and with a supply tank. The supply tank supplies processing fluids to the processing fluid re-circulation system. The supply tank selectively receives processing fluids from one of the holding tank and an external source. The external source is capable of selectively providing one of fresh processing fluids and adjusting processing fluids to the supply tank.

In yet another embodiment, a method for re-circulating processing fluids in a brush box scrubbing tool of a semiconductor wafer processing system is disclosed. The method includes preparing chemicals for use in the brush box scrubbing tool of the semiconductor wafer processing system, and introducing the prepared chemicals into a fluid re-circulation system of the brush box scrubbing tool The method further provides for monitoring a concentration of the prepared chemicals in the fluid re-circulation system of the brush box scrubbing tool. The concentration of the prepared chemicals is adjusted as required.

The advantages of the present invention are numerous. One notable benefit and advantage of the invention is a marked reduction in the cost of ownership and operation of a brush scrubbing tool, station or integrated system. Typical processing systems consume a large volume of water and chemicals, both during processing, and at idle. Embodiments of the present invention significantly reduce chemical and water consumption while maintaining processing effectiveness, and tool, station, or system readiness.

Another benefit is a decrease in the environmental impact of tools, stations, and systems incorporating embodiments of the present invention. By implementing embodiments of the present invention, tools, stations, and systems consume significantly less processing chemicals and DI water, and therefore generate significantly less waste.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for a fluid re-circulation system is disclosed. In preferred embodiments, the fluid re-circulation system includes a diverter to select between re-circulation and waste, and a collection and a supply tank in a pressurized system with one or more filters enabling the re-circulation of usually consumed chemicals, DI water, or other processing fluids.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
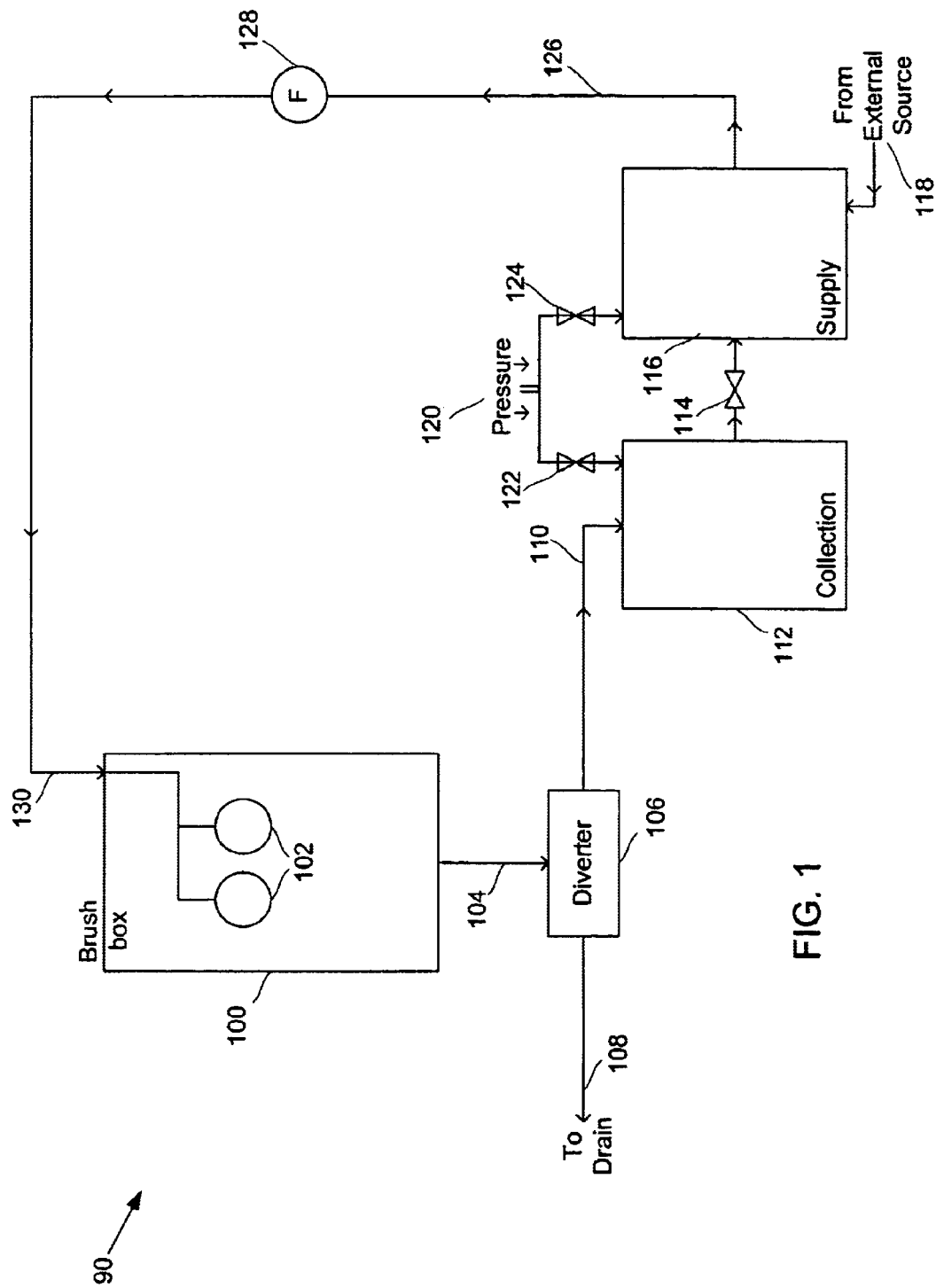
FIG. 1 shows a schematic of a fluid re-circulation system in accordance with one embodiment of the present invention.

FIG. 1 shows a schematic 90 of a fluid re-circulation system in accordance with one embodiment of the present invention. The illustrated embodiment shows a brush box 100 having two brushes 102. Cleaning chemicals, DI water, or any other desired fluids are delivered through the brush 102 during the processing of a substrate (not shown). Embodiments of brush boxes 100 further include fluid delivery to desired locations on either or both surfaces of the substrate during processing through sprayers, nozzles, manifolds, and the like positioned in a plurality of locations within the brush box 100.

During substrate processing in the brush box 100, chemicals, DI water, and any other fluids drain 104 from brush box 100 to diverter 106. In one embodiment, diverter 106 is a directional valve directing the flow of fluids to re-circulation drain 110, or to system waste 108. Fluids diverted to system waste 108 are drained and discarded as waste in accordance with usual substrate processing methods and practices. Fluids diverted to re-circulation drain 110 are processed through the re-circulation system as described below.

In one embodiment, fluids flowing through re-circulation drain 110 are collected in collection tank 112. Collection tank 112 is of any desired volume which, in one embodiment, is of sufficient size to accommodate a selected re-circulation cycle. By way of example, a re-circulation cycle may be selected to support one or more batches of wafers, or a partial batch of wafers. As is known, a typical batch of wafers includes approximately 25–50 wafers, and a volume of fluid required to process 25–50 wafers may be more than is practical for a single collection tank 112, as will be described in greater detail below. In other embodiments, a re-circulation cycle can be selected based on a set number of wafers or other substrates irrespective of batch, and in still other embodiments, a re-circulation cycle is selected and maintained based on a period of time irrespective of the number of wafers or other substrates processed.

Collection tank 112 is in flow communication with supply tank 116 through valve 114. In one embodiment, both collection tank 112 and supply tank 116 are pressurized through pressure supply 120. Pressure supply 120 can be pneumatic, hydraulic, or any suitable method for pressurizing collection tank 112 and supply tank 116. Valves 122 and 124, in conjunction with valve 114, provide for positive control of pressure in each of the collection tank 112 and the supply tank 116. External source 118 provides for flow of fresh chemicals, DI water, or other fluids into supply tank 116 for circulation within the fluid re-circulation system.

From supply tank 116, chemicals, DI water, or other fluids flow through fluid supply 126 through filter 128, and into brush box supply 130. Brush box supply 130 delivers the chemicals, DI water, or other fluids into the brush box 100 for dispensing through the brush 102, and through sprayers, nozzles, manifolds, and the like as described above.

Filter 128 is shown in an exemplary location of the fluid re-circulation system. By-products of wafer scrubbing, particles, contaminates, and the like are typically captured and suspended in the chemicals, DI water, and other fluids during the cleaning, scrubbing, or other processing within the brush box 100. In one embodiment of the invention, filter 128 is provided for fluid filtration to enable repeated use and re-circulation of the chemicals, DI water, or other fluids through the fluid re-circulation system. In other embodiments, additional filters 128, screens (not shown) and the like are provided at desired locations along and within the re-circulation system to achieve a desired degree of cleanliness of the chemicals, DI water, or other fluids.

Figure 2:
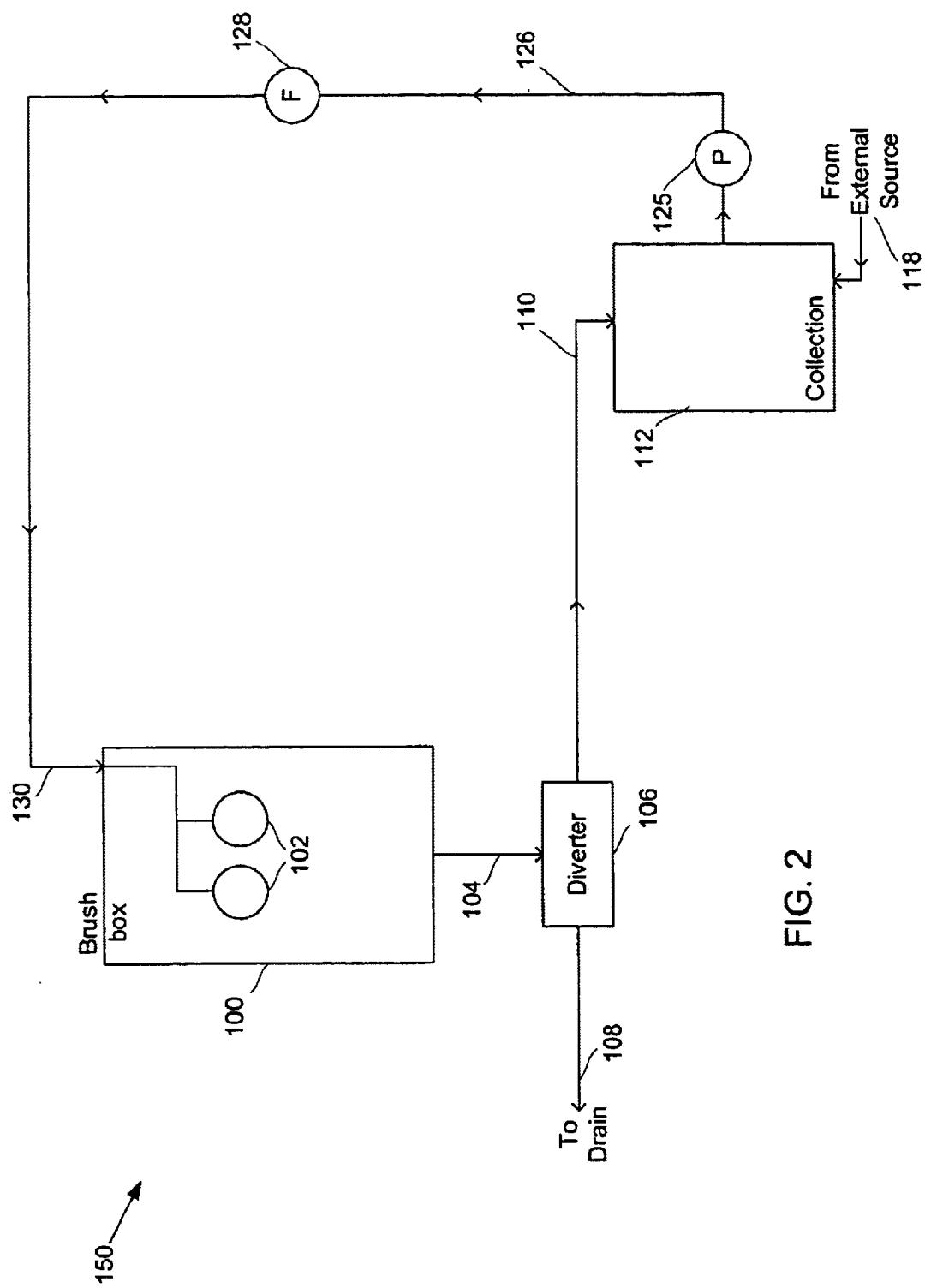
FIG. 2 shows a schematic of a fluid re-circulation system in accordance with another embodiment of the present invention.

FIG. 2 shows a schematic 150 of a fluid re-circulation system in accordance with another embodiment of the present invention. Similar to FIG. 1, the embodiment illustrated in FIG. 2 shows a brush box 100 having two brushes 102. The illustrated brush box 100 is exemplary only. Other brush box 100 embodiments include scrubbers with two sets of brushes 102, pads, a horizontal orientation, and various other variations of brush box 100 scrubbers. Cleaning chemicals, DI water, or any other desired fluids are delivered through the brush 102 during the processing of a substrate (not shown). Embodiments of brush boxes 100 further include fluid delivery to desired locations on either or both surfaces of the substrate during processing through sprayers, nozzles, manifolds, and the like positioned in a plurality of locations within the brush box 100.

As described above in reference to FIG. 1, chemicals, DI water, and any other fluids used in processing drain 104 from brush box 100 to diverter 106. In one embodiment, diverter 106 is a directional valve directing the flow of fluids to re-circulation drain 110, or to system waste 108. Fluids diverted to system waste 108 are drained and discarded as waste in accordance with usual substrate processing methods and practices. Fluids diverted to re-circulation drain 110 are processed through the re-circulation system.

In the illustrated embodiment, fluids flowing through re-circulation drain 110 flow into collection tank 112. Further, fresh chemicals, DI water, or other fluids flow into collection tank 112, and therefore into the fluid re-circulation system, from external source 118. Collection tank 112, therefore, acts as the reservoir for fluids within the fluid re-circulation system. When it is desired to discard spent or sufficiently re-used chemicals, DI water, or other fluids, diverter 106 is configured to drain fluids to system waste 108, and fresh chemicals, DI water, or other fluids are introduced into the system from an external source 118 into collection tank 112.

In the illustrated embodiment, chemicals, DI water, or other fluids are pumped from collection tank 112 through fluid supply 126 through filter 128, and into brush box supply 130. Pump 125 can be any desired fluid pump, producing sufficient flow for the volume of the system, and having any surface that may come into direct or sustained contact with the chemicals, DI water, or other fluids that may be used in the fluid re-circulation system, constructed of a material sufficiently resistant to corrosion, damage, decay, dissolution, and the like, depending on the selected chemicals, DI water, or other fluids. Brush box supply 130 delivers the chemicals, DI water, or other fluids into the brush box 100 for dispensing through the brush 102, and through sprayers, nozzles, manifolds, and the like as described above.

As described above in reference to FIG. 1, filter 128 is shown in an exemplary location of the fluid re-circulation system. By-products of wafer or other substrate scrubbing, particles, contaminates, and the like are typically captured and suspended in the chemicals, DI water, and other fluids during the cleaning, scrubbing, or other processing within the brush box 100. In one embodiment of the invention, filter 128 is provided for fluid filtration to enable repeated use and re-circulation of the chemicals, DI water, or other fluids through the fluid re-circulation system. In other embodiments, additional filters 128, screens (not shown) and the like are provided at desired locations along and within the re-circulation system to achieve a desired degree of cleanliness of the chemicals, DI water, or other fluids.

Figure 3:
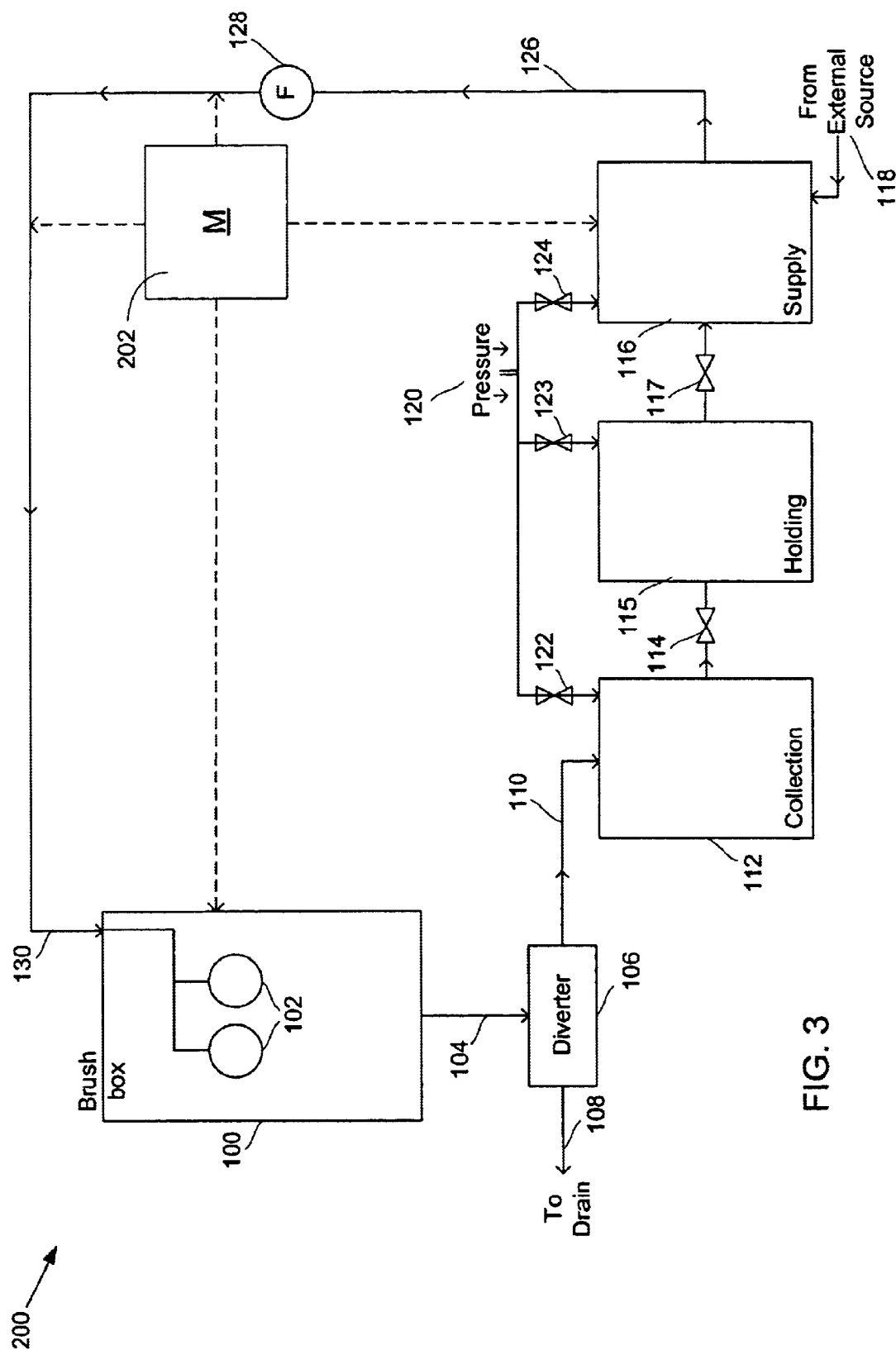
FIG. 3 shows a schematic of a fluid re-circulation system in accordance with another embodiment of the present invention.

FIG. 3 shows a schematic 200 of a fluid re-circulation system in accordance with another embodiment of the present invention. The illustrated embodiment shows a brush box 100 having two brushes 102. As described above in reference to FIG. 2, any embodiment of the present invention can include a brush box 100 of any desired design and configuration such as, for example, a brush box 100 having two sets of opposing brushes, a brush box 100 configured with polishing pads instead of or in addition to the illustrated brushes 102, a horizontally oriented brush box 100, or any other type or configuration of brush box 100 using chemicals, DI water, or other fluids for substrate processing as desired. Cleaning chemicals, DI water, or any other desired fluids are delivered through the brush 102 during the processing of a substrate (not shown). Embodiments of brush boxes 100 further include fluid delivery to desired locations on either or both surfaces of the substrate during processing through sprayers, nozzles, manifolds, and the like positioned in one or more locations within the brush box 100.

As described above in reference to FIGS. 1 and 2, chemicals, DI water, and any other fluids used for substrate processing in brush box 100 drain 104 from brush box 100 to diverter 106. In one embodiment, diverter 106 is a directional valve directing the flow of fluids to re-circulation drain 110, or to system waste 108. Fluids diverted to system waste 108 are drained and discarded as waste in accordance with usual substrate processing methods and practices. In an embodiment of the present invention, diverter is used to send chemicals and other processing fluids directly to system waste 108 in the event chemicals are selected for use that are incompatible with the materials used to construct the collection tank 112, the holding tank 115, and the supply tank 116, or any tank or combination of tanks in the particular embodiment. Fluids diverted to re-circulation drain 110 are processed through the re-circulation system as described in detail below.

In one embodiment, fluids flowing through re-circulation drain 110 are collected in collection tank 112. Collection tank 112 is of any desired volume which, in one embodiment, is of sufficient size to accommodate a selected re-circulation duty cycle. By way of example, a re-circulation duty cycle may be implemented to accommodate one or more batches of wafers, or a partial batch of wafers. As is known, a typical batch of wafers includes approximately 25–50 wafers, and a volume of fluid required to process 25–50 wafers may be more than is practical for a single collection tank 112. In the illustrated embodiment, a holding tank 115 is incorporated to increase the volume of fluid that re-circulates through the system, and thereby accommodates a higher duty cycle. In one embodiment, use of a holding tank allows achievement of up to a 100% duty cycle, if desired. In such an embodiment, fluids flow freely from collection tank 112 to holding tank 115. Valve 114 is then secured, and holding tank 115 is pressurized to a pressure greater than that of supply tank 116. During this transfer of re-circulating fluids from holding tank 115 to supply tank 116, the fluids draining from the brush box 100 are collected in collection tank 112.

As shown in FIG. 3, one embodiment provides for collection tank 112 to be in flow communication with holding, tank 115 through valve 114. Holding tank 115 is further in flow communication with supply tank 116 through valve 117. In one embodiment, collection tank 112, holding tank 115, and supply tank 116 are all pressurized through a common pressure supply 120. In an alternative embodiment, an independent pressure supply 120 is provided for each of the collection tank 112, the holding tank 115, and the supply tank 116, and regulated accordingly to maintain a desired pressure as required for each tank as well as a desired pressure within the fluid re-circulation system. Pressure supply 120 can be pneumatic, hydraulic, or any suitable method for pressurizing collection tank 112, the holding tank 115, and the supply tank 116. Valves 122, 123, and 124, in conjunction with valves 114 and 117, provide for positive control of pressure in each of the collection tank 112, the holding tank 115 and the supply tank 116. External source 118 provides for flow of fresh chemicals, DI water, or other fluids into supply tank 116 for circulation within the fluid re-circulation system.

From supply tank 116, chemicals, DI water, or other fluids flow through fluid supply 126 through filter 128, and into brush box supply 130. Brush box supply 130 delivers the chemicals, DI water, or other fluids into the brush box 100 for dispensing through the brush 102, and through sprayers, nozzles, manifolds, and the like as described above.

As described above in reference to FIGS. 1 and 2, filter 128 is shown in an exemplary location of the fluid re-circulation system. By-products of wafer scrubbing, particles, contaminates, and the like are typically captured and suspended in the chemicals, DI water, and other fluids during the cleaning, scrubbing, or other processing within the brush box 100. In one embodiment of the invention, filter 128 is provided for fluid filtration to enable repeated use and re-circulation of the chemicals, DI water, or other fluids through the fluid re-circulation system. In other embodiments, additional filters 128, screens (not shown) and the like are provided at desired locations along and within the re-circulation system to achieve a desired degree of cleanliness of the chemicals, DI water, or other fluids.

As described above, a re-circulation duty cycle can be implemented as desired according to the embodiment of the present invention used, and the desired degree of fluid filtering. By way of example, if one batch of substrates includes 50 substrates for processing, if a cycle time for substrate processing is approximately 40 seconds, and if it takes approximately 10 seconds to remove a substrate and insert another substrate into brush box 100, it might take approximately 42 minutes to process a batch of substrates. If the fluid flow rate through the brush box 100 is approximately two liters per minute, then it would require about 84 liters for a 100% duty cycle, or approximately 22 gallons flowing through the brush box 100 for the processing of one batch of substrates.

Embodiments of the present invention can be implemented with less than 100% duty cycle by supplementing re-circulated chemicals with fresh chemicals during processing. In the embodiment illustrated in FIG. 1, it may not be feasible to replenish the supply tank 116 from the collection tank 112 during substrate batch processing while maintaining the required pressure enabling flow within the fluid re-circulation system, and in one embodiment, fresh chemicals, DI water, or other fluids can be provided from an external source 118 in a regular, periodic, intermittent, or other desired cycle. In another embodiment, fluid replenishment from collection tank 112 to supply tank 116 can be accomplished incrementally during substrate exchange in the brush box 100.

In the embodiment illustrated in FIG. 3, the holding tank 115 enables replenishment of re-circulated cleaning chemicals, DI water, or other fluids during the batch processing, and thereby a higher duty cycle, up to about 100%, can be maintained. Similarly, in the embodiment illustrated in FIG. 2, pump 125 obviates the need for a supply tank 116, and the ability of the system to maintain a high duty cycle up to and including approximately 100% is limited only by the achievable flow rate dependent upon the capacity of the drain line and pump 125, and the ability to achieve the desired or required level of filtration at various flow rates.

In one embodiment of the invention, chemicals are re-circulated through the fluid re-circulation system. Typically, chemicals must be maintained at a specific concentration or strength, and can become diluted in the re-circulation process when, by way of example, the chemicals mix with DI water during scrubbing and rinsing operations, or mixing with some other rinsing agent or some other fluid. In addition to filtration to maintain a desired level of purity or cleanliness, embodiments of the present invention provide for monitoring of chemical concentration of the chemicals re-circulating through the fluid re-circulation system. Monitoring of chemical concentration can be accomplished at any desired location by any desired method such as, by way of example, monitoring of the pH, monitoring of the refractive index, by titration, by use of an empirical formula, and the like. In FIG. 3, monitor 202 is illustrated. Monitor 202 can be configured to and implemented in any embodiment as described. For continued or sustained use of the fluid re-circulation system, the chemical concentration can be adjusted by spiking, diluting (should the concentration require dilution), or the introduction of fresh chemicals, according to processing requirements and operator desires.

Figure 4:
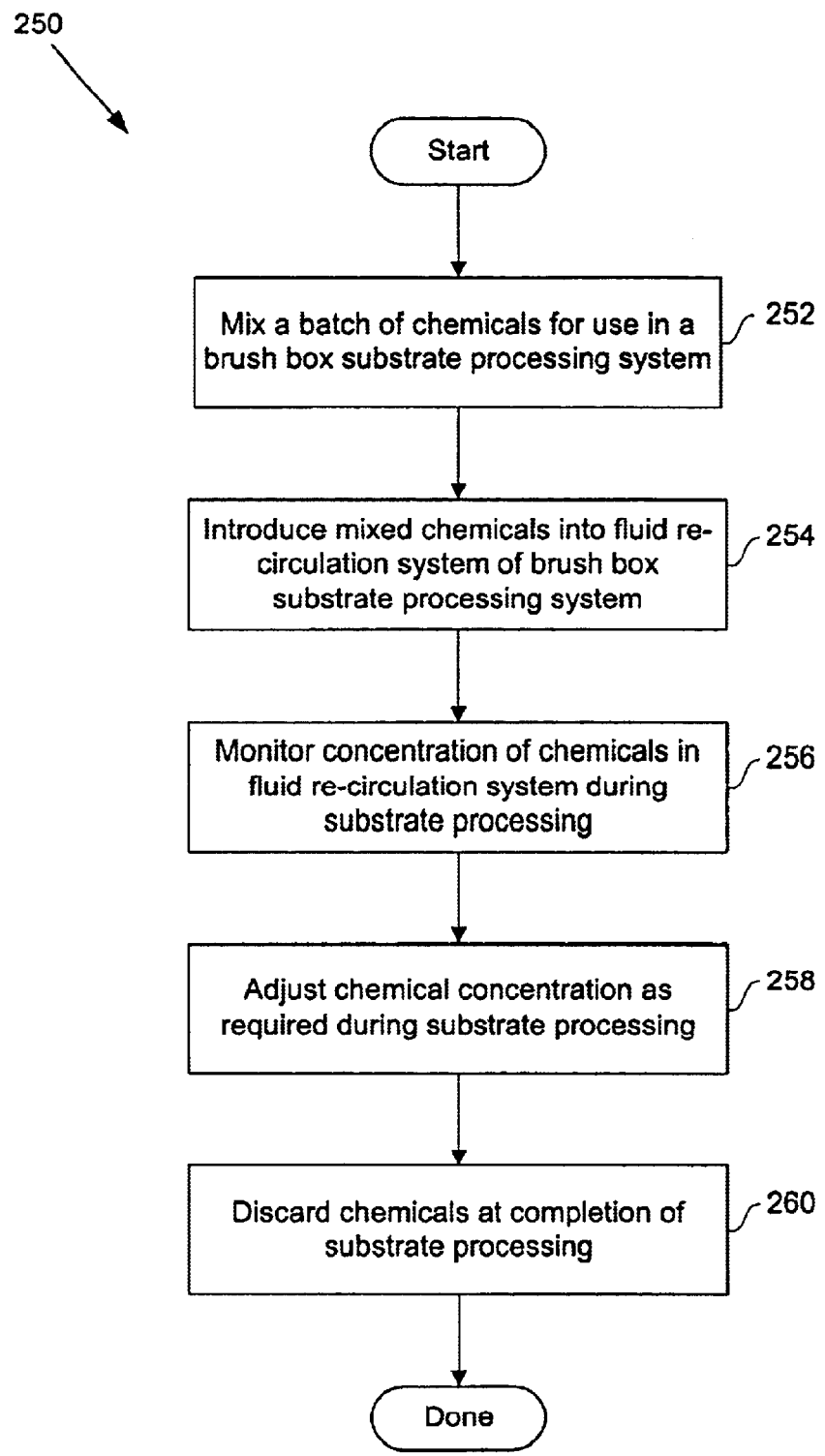
FIG. 4 shows a flow chart diagram of a method of fluid re-circulation in accordance with one embodiment of the present invention.

As described above in reference to FIGS. 1–3, embodiments of the present invention provide for re-circulation of chemicals, DI water, or other processing fluids in brush box tools, stations, or systems of substrate processing systems. FIG. 4 shows a flow chart diagram 250 of a method of fluid re-circulation in accordance with one embodiment of the present invention. The method begins with operation 252 in which a batch of chemicals for use in a brush box substrate processing system are mixed or otherwise prepared. Selected chemicals are known in the art, and are selected according to the desired process to be accomplished in the brush box tool, station, or system.

The method continues with operation 254 in which the mixed or otherwise prepared chemicals are introduced into the fluid re-circulation system of the brush box tool, station or system in a substrate processing system. As described above in reference to FIGS. 1–3, chemicals are introduced from an external source 118 into supply tank 116, in one embodiment of the invention.

Next, the method continues with operation 256 in which the concentration of the chemicals in the re-circulation system is monitored during substrate processing. As described above, selected chemicals must be maintained at a desired concentration, strength, pH, and the like to effectively perform the operations desired. Chemical concentration can be diluted during filtration, due to mixing with DI water or other rinsing agents, and the like. In one embodiment of the invention, the concentration of chemicals in the re-circulation system is constantly monitored to maintain the desired concentration, strength, pH, and the like. Methods of monitoring include sampling of pH, titration, measuring refractive index, and other such monitoring and measuring procedures.

The method continues with operation 258 in which the chemical concentration of the chemicals circulating through the fluid re-circulation system is adjusted as desired. Adjustment of the chemical concentration can include spiking of chemicals to raise the concentration, diluting chemicals as desired, introducing fresh chemicals into the fluid re-circulation system, or any other effective process of chemical concentration adjustment.

The method concludes with operation 260 in which chemicals are discarded at the completion of substrate processing. In an embodiment in which processing chemicals are used and re-circulated, the chemicals are re-circulated and used in processing for a desired duration, number of wafers, number of batches of wafers, and other such methods of measuring use. When the specified event such as completion of processing a set number of wafers, a set number of batches of wafers, or a specified time period occurs or expires, the chemicals are discarded. When the chemicals are discarded, the method is done.

In one embodiment, the present invention is particularly effective and useful when a brush box tool, station, or system is operated in an idle mode. As is known, substrate manufacturing and processing equipment is most process-efficient, and most cost-efficient, when maintained in a process-ready mode. Typically, process-ready mode is maintained by operating the tool, station, or system in an idle mode when substrates are not being processed. For a brush box, idle mode includes constant flow of at least DI water or other fluids through the system, and in particular, through the processing brushes, pads, and the like in order to prevent drying out of the processing surfaces. In the idle mode, a brush box tool, station, or system continues to consume DI water, or other fluid, at about four liters per minute. The idle mode, therefore, continues to consume large quantities of DI water or other fluids, and embodiments of the present invention significantly reduce the consumption of DI water or other fluids, as well as significantly reduce the amount of fluid waste generated, thereby reducing the cost of use and ownership of the tool, station, or system, and resulting in more efficient implementation of the tool, station, or system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. In a brush box of a semiconductor wafer processing system, a fluid re-circulation system, comprising:
   a supply tank for containing processing fluids to be used in the brush box, the supply tank having an inlet from an external source and an outlet;
   a collection tank coupled in flow communication with the supply tank, the collection tank having an inlet and an outlet;
   a diverter, the brush box being coupled in flow communication with the diverter, and the diverter being coupled in flow communication with the collection tank; and
   a monitor, wherein the monitor provides for monitoring of a concentration of processing fluids circulating through the fluid re-circulation system.

2. The fluid re-circulation system of claim 1, further comprising:
   a pressure source coupled in flow communication with the collection tank and the supply tank; and
   a filter configured to filter the processing fluids flowing in the fluid re-circulation system,
   wherein the pressure source is configured to pressurize the collection tank and the supply tank, and to provide a force necessary to maintain flow of the processing fluids through the fluid re-circulation system.

3. The fluid re-circulation system of claim 1, wherein the diverter is a directional valve capable of selectively flowing the processing fluids from the brush box of the brush box substrate processing system to one of system drain and the collection tank.

4. The fluid re-circulation system of claim 1, wherein the supply tank provides for supplementing the processing fluids circulating within the fluid re-circulating system with additional processing fluids from the external source to maintain a desired chemical concentration of processing fluids within the fluid re-circulating system.

5. The fluid re-circulation system of claim 1, wherein the monitor providing for the monitoring of the concentration of processing fluids includes one of a monitor of a pH of the processing fluids circulating through the fluid re-circulation system, a monitor of a refractive index of the processing fluids circulating through the fluid re-circulation system, and a monitor by titration of the processing fluids circulating through the fluid re-circulation system.

6. A fluid re-circulation system for use in a semiconductor wafer brush box scrubbing tool, comprising:
   a collection tank for capturing processing fluids used in the semiconductor wafer brush box scrubbing tool;
   a holding tank for maintaining a sufficient volume of processing fluids in the fluid re-circulation system to enable a processing duty cycle of up to 100 percent in the semiconductor wafer brush box scrubbing tool; and
   a supply tank, the supply tank having an inlet from an external source and being capable of selectively receiving one of re-circulating processing fluids, fresh processing fluids, and adjusting processing fluids for adjusting a concentration of processing fluids within the fluid recirculation system,
   wherein the semiconductor wafer brush box scrubbing tool is coupled in flow communication with a diverter and the diverter is coupled in flow communication with the collection tank.

7. The fluid re-circulation system of claim 6, further comprising:
   a pump configured to maintain a flow of fluids through the fluid re-circulation system; and
   a filter configured to filter the processing fluids in the fluid re-circulation system.

8. The fluid re-circulation system of claim 6, wherein the diverter is a directional valve capable of selectively flowing the processing fluids from the brush box of the brush box substrate processing system to one of system drain and the collection tank.

9. The fluid re-circulation system of claim 7, wherein the pump is configured to sustain a pressure within the fluid re-circulation system to maintain approximately a 100% duty cycle of fluid re-circulation within the semiconductor wafer brush box scrubbing tool.

10. The fluid re-circulation system of claim 7, further comprising a monitor for monitoring a chemical concentration of the processing fluids flowing through the fluid re-circulation system.

11. The fluid re-circulation system of claim 10, wherein the monitor for monitoring the chemical concentration of the processing fluids flowing through the fluid re-circulation system includes one of a monitor of a pH of the processing fluids flowing through the fluid re-circulation system, a monitor of a refractive index of the processing fluids flowing through the fluid re-circulation system, and a monitor by titration of the processing fluids flowing through the fluid re-circulation system.

12. A processing fluid re-circulation system, comprising:
 a brush box processing tool for processing a semiconductor wafer, the brush box processing tool having an inlet for receiving processing fluids;
 a collection tank for receiving processing fluids from the brush box processing tool;
 a diverter, the brush box processing tool being in flow communication with the diverter and the diverter being in selective flow communication with one of the collection tank and a drain;
 a holding tank for receiving processing fluids from the collection tank, the holding tank being coupled in flow communication with the collection tank and with a supply tank; and
 a supply tank for supplying processing fluids to the processing fluid re-circulation system, the supply tank selectively receiving processing fluids from one of the holding tank and an external source, the external source capable of selectively providing one of fresh processing fluids and adjusting processing fluids to the supply tank.

13. The processing fluid re-circulation system of claim 12, further comprising:
 a pressure source coupled in flow communication with the collection tank, the holding tank, and the supply tank; and
 a filter configured to filter the processing fluids flowing in the fluid re-circulation system,
 wherein the pressure source is configured to pressurize each of the collection tank, the holding tank, and the supply tank, and to provide a force necessary to maintain flow of the processing fluids through the processing fluid re-circulation system.

14. The processing fluid re-circulation system of claim 13, wherein the pump is configured sustain a pressure within the processing fluid re-circulation system to maintain a 100% duty cycle of processing fluid re-circulation within the processing tool.

15. The processing fluid re-circulation system of claim 13, further comprising a monitor for monitoring a chemical concentration of the processing fluids flowing through the processing fluid re-circulation system.

16. The processing fluid re-circulation system of claim 15, wherein the monitor for monitoring the chemical concentration of the processing fluids flowing through the processing fluid re-circulation system includes one of a monitor of a pH of the processing fluids flowing through the processing fluid re-circulation system, a monitor of a refractive index of the processing fluids flowing through the processing fluid re-circulation system, and a monitor by titration of the processing fluids flowing through the processing fluid re-circulation system.

* * * * *